United States Patent
Lei et al.

(10) Patent No.: US 11,546,066 B2
(45) Date of Patent: Jan. 3, 2023

(54) TRANSMITTER DEVICE AND CALIBRATION METHOD

(71) Applicant: REALTEK SEMICONDUCTOR CORPORATION, Hsinchu (TW)

(72) Inventors: Liang-Huan Lei, Hsinchu (TW); Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 254 days.

(21) Appl. No.: 17/131,840

(22) Filed: Dec. 23, 2020

(65) Prior Publication Data

US 2021/0336709 A1    Oct. 28, 2021

(30) Foreign Application Priority Data

Apr. 23, 2020   (TW) .................................. 109113669

(51) Int. Cl.
   *H04B 17/11*    (2015.01)
   *H04B 1/02*     (2006.01)
   (Continued)

(52) U.S. Cl.
   CPC ......... *H04B 17/11* (2015.01); *H03K 19/0005* (2013.01); *H03K 19/0185* (2013.01); *H04B 1/02* (2013.01); *H04B 17/19* (2015.01)

(58) Field of Classification Search
   CPC .......... H04B 17/11; H04B 17/19; H04B 3/46; H04B 1/02; H04B 1/581; H04B 10/0775;
   (Continued)

(56) References Cited

U.S. PATENT DOCUMENTS 7,843,264 B2   11/2010   Davierwalla et al.
8,289,064 B2   10/2012   Yi et al.
(Continued)

FOREIGN PATENT DOCUMENTS

TW   201001905 A1   1/2010
TW   201134088 A    10/2011

OTHER PUBLICATIONS

OA letter of the counterpart TW application (appl. No. 109113669) dated Dec. 29, 2020 . . . Summary of the OA letter: Claims 1-3, 5, 8-10 are alleged being unpatenable over cited reference 1 (TW 201001905 A, also published as U.S. Pat. No. 7,843,264 B2) in view of cited reference 2 (TW 201134088 A1, also published as U.S. Pat. No. 8,289,064 B2).

*Primary Examiner* — Khanh C Tran
(74) *Attorney, Agent, or Firm* — WPAT, PC

(57) ABSTRACT

A transmitter device includes a transmitter circuit, a voltage generator circuit, and a calibration circuit. The transmitter circuit is configured to selectively operate in a calibration mode or a normal mode in response to a first control signal, in which the transmitter circuit has a first output terminal and a second output terminal. The voltage generator circuit is configured to generate a bias voltage, in which the bias voltage has a first level in the calibration mode and has a second level in the normal mode, and the first level is different from the second level. The calibration circuit is configured to be turned on in the calibration mode according to the bias voltage and a second control signal, in order to calibrate a level of the first output terminal and a level of the second output terminal.

20 Claims, 4 Drawing Sheets

(51) Int. Cl.
*H04B 17/19* (2015.01)
*H03K 19/00* (2006.01)
*H03K 19/0185* (2006.01)

(58) Field of Classification Search
CPC ........ H04B 1/04; H04B 3/56; H03K 19/0005; H03K 19/0185
See application file for complete search history.

(56) References Cited

U.S. PATENT DOCUMENTS

| | | | |
|---|---|---|---|
| 8,683,098 B2 * | 3/2014 | Johnson | H04L 25/0274 710/33 |
| 2010/0153792 A1 * | 6/2010 | Jang | G11C 29/02 714/E11.001 |
| 2016/0149552 A1 * | 5/2016 | Kwak | H03H 7/38 375/295 |
| 2016/0233846 A1 * | 8/2016 | Pavao-Moreira | G01S 7/032 |

\* cited by examiner

TRANSMITTER DEVICE AND CALIBRATION METHOD

BACKGROUND OF THE INVENTION

1. Field of the Invention

The present disclosure relates to a transmitter device. More particularly, the present disclosure relates to a transmitter device having an internal testing circuit and a calibration method.

2. Description of Related Art

With the devolvement of manufacturing process, a threshold voltage of a transistor is getting higher, and a supply voltage is getting lower. Transistors formed in advanced processes are not suitable for a circuitry that operates in higher voltage. If the transistors formed in advanced processes are employed in the aforementioned circuitry, the transistors may be damaged, and thus the reliability of overall system is reduced.

SUMMARY OF THE INVENTION

In some embodiments, a transmitter device includes a transmitter circuit, a voltage generator circuit, and a calibration circuit. The transmitter circuit is configured to selectively operate in a calibration mode or a normal mode in response to a first control signal, in which the transmitter circuit has a first output terminal and a second output terminal. The voltage generator circuit is configured to generate a bias voltage, wherein the bias voltage has a first level in the calibration mode and has a second level in the normal mode, and the first level is different from the second level. The calibration circuit is configured to be turned on in the calibration mode according to the bias voltage and a second control signal, in order to calibrate a level of the first output terminal and a level of the second output terminal.

In some embodiments, a calibration method is for calibrating a level of a first output terminal of a transmitter circuit and a level of a second output terminal of the transmitter circuit, in which the transmitter circuit is configured to selectively operate in a calibration mode or a normal mode in response to a first control signal, and the calibration method includes the following operations: generating a bias voltage, wherein the bias voltage has a first level in the calibration mode and has a second level in the normal mode, and the first level is different from the second level; and calibrating the level of the first output terminal and the level of the second output terminal in the calibration mode according to the bias voltage and a second control signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1A:
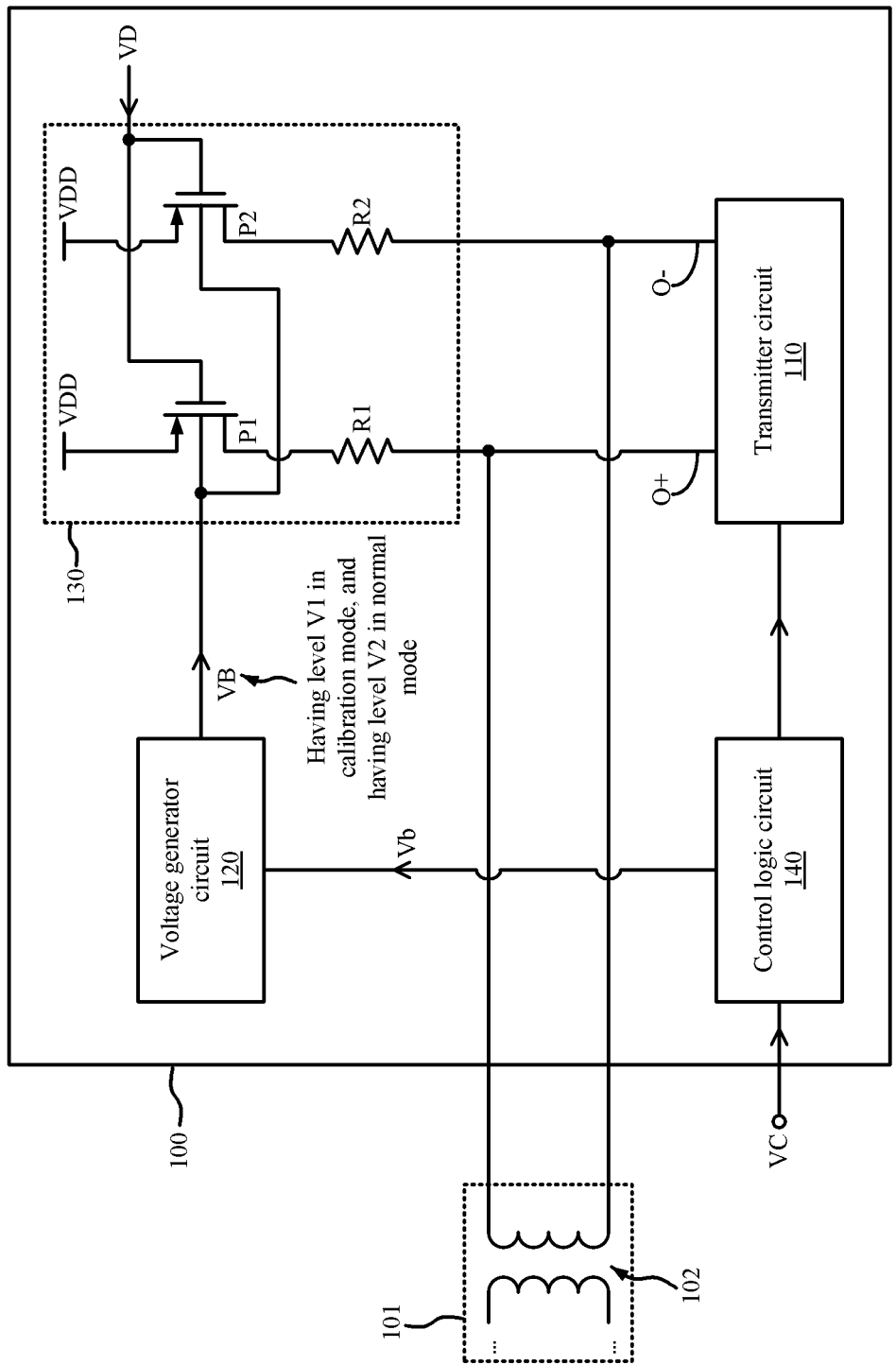
FIG. 1A is a schematic diagram of a transmitter device according to some embodiments of the present disclosure.

FIG. 1A is a schematic diagram of a transmitter device 100 according to some embodiments of the present disclosure. In some embodiments, the transmitter device 100 may be implemented with an Ethernet network system. For example, the transmitter device 100 may be connected with an external apparatus (not shown) via a medium dependent interface (MDI) 101.

In some embodiments, the transmitter device 100 includes a transmitter circuit 110, a voltage generator circuit 120, a calibration circuit 130, and a control logic circuit 140. The transmitter circuit 110 has an output terminal O+ and an output terminal O− which are connected to an inductive component 102 in the medium dependent interface 101, in order to transmit signal(s). The transmitter circuit 110 may include (but not limited to) an analog to digital converter circuit, a mixer circuit, and/or a power amplifier circuit. In response to a control signal VC, the transmitter circuit 110 selectively operates in a calibration mode or a normal mode based on a control of the control logic circuit 140. For example, when the transmitter device 100 is not connected to the inductive component 102, the transmitter circuit 110 operates in the calibration mode. Under this condition, internal circuits of the transmitter circuit 110 can be tested, in order to verify whether operations of the transmitter circuit 110 in an actual environment (e.g., after being connected with the inductive component 102) is correct. When the transmitter device 100 is connected to the external apparatus via the medium dependent interface 101, the transmitter circuit 110 operates in the normal mode to transfer signals. In some embodiments, the calibration mode is utilized by a manufacturer of the transmitter device 100, and the normal mode is utilized by a user of the transmitter device 100, but the present disclosure is not limited thereto.

In some embodiments, the control logic circuit 140 may be (but not limited to) a digital signal processor (DSP) circuit. The voltage generator circuit 120 is configured to generate a bias voltage VB according to a voltage Vb. In some embodiments, the bias voltage VB has a level V1 in the calibration mode, and has a level V2 in the normal mode, in which the level V1 is different from the level V2. For example, the level V1 is lower than the level V2. In some embodiments, the voltage generator circuit 120 generates the bias voltage VB having the level V1 or the level V2 according to the control signal VC. For example, the voltage generator circuit 120 may be (but not limited to) a low dropout (LDO) regulator circuit. The control logic circuit 140 switches the voltage Vb to have the corresponding level according to the control signal VC. In the calibration mode, the control logic circuit 140 switches the level of the voltage Vb to be the level V1 according to the control signal VC. In the normal mode, the control logic circuit 140 switches the level of the voltage Vb to be the level V2 according to the control signal VC. As a result, the voltage generator circuit 120 adjusts the voltage Vb to generate the bias voltage VB having the corresponding level. For example, when the control signal VC has a high level (e.g., the level being the same as the level of a supply voltage VDD), the transmitter device 100 operates in the normal mode. In response to the control signal VC, the control logic circuit 140 outputs the voltage Vb having the level V2. Alternatively, when the control signal VC has a low level (e.g., 0 volt), the transmitter device 100 operates in the calibration mode. In response to the control signal VC, the control logic circuit 140 outputs the voltage Vb having the level V1.

The calibration circuit 130 is coupled to the output terminal O+ and the output terminal O−. In the calibration mode, the calibration circuit 130 is configured to be turned on according to the bias voltage VB and a control signal VD, in order to calibrate a level of the output terminal O+ (e.g., a common mode level) and a level of the output terminal O− (e.g., a common mode level). In some embodiments, the control signal VD is associated with the control signal VC. In some embodiments, the control logic circuit 140 directly generates the control signal VD according to the control signal VC. Alternatively, in some embodiments, the control logic circuit 140 may control at least one additional circuit (not shown) to generate the control signal VD according to the control signal VC. In some embodiments, the control signal VD may be replaced with the control signal VC (i.e., gates of the transistors P1 and P2 can be changed to receive the control signal VC).

In some embodiments, the calibration circuit 130 is configured to adjust the level of the output terminal O+ in the calibration mode to be close to the level of the output terminal O+ in the normal mode, and to adjust the level of the output terminal O− in the calibration mode to be close to the level of the output terminal O− in the normal mode. In other words, the calibration circuit 130 is configured to provide the similar (or the same) biasing conditions of the normal mode to the transmitter circuit 110 operating in the calibration mode, in order to test the transmitter circuit 110. In the normal mode, the calibration circuit 130 is configured to be turned off according to the bias voltage VB and the control signal VD.

Figure 1B:
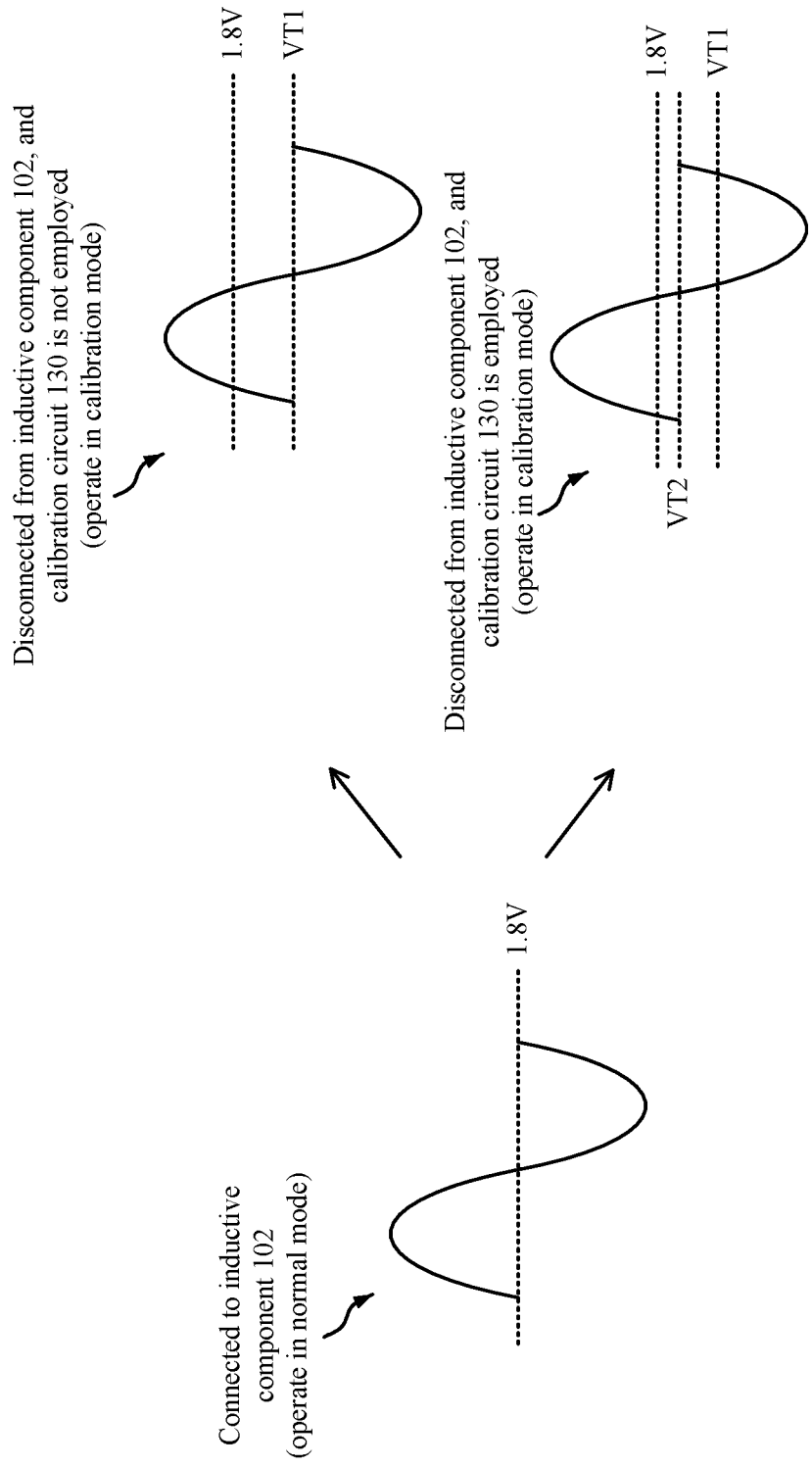
FIG. 1B is a schematic diagram showing a waveform of a signal on the output terminals in FIG. 1A according to some embodiments of the present disclosure.

FIG. 1B is a schematic diagram showing a waveform of a signal on the output terminal O+ or the output terminal O− in FIG. 1A according to some embodiments of the present disclosure. In practical applications, the output terminal O+ and the output terminal O− are coupled to the inductive component 102, and the transmitter circuit 110 operates in the normal mode. Under this condition, the common mode level of the signal on the output terminal O+ (and/or the output terminal O−) is about 1.8 volts (V). In a factory test, the output terminal O+ and the output terminal O− are not coupled to the inductive component 102 (i.e., disconnected from the inductive component 102), and the transmitter circuit 110 operates in the calibration mode. If the calibration circuit 130 is not employed and the output terminal O+ and the output terminal O− are differential output terminals, a common mode level VT1 of a signal on the output terminal O+ (and/or the output terminal O−) will be lower than the common mode level in the normal mode (e.g., 1.8V in FIG. 1B).

If the common mode level VT1 is too low, it indicates that a difference between the biasing condition of the transmitter circuit 110 in the calibration mode and that of the transmitter circuit 110 in the practical applications is too much. As a result, a voltage (or current) generated from the transmitter circuit 110 in the calibration mode may be different from the voltage (or current) generated from the transmitter circuit 110 in other modes. For example, the output terminal O+ and the output terminal O− may be output terminals of a digital to converter circuit in the transmitter circuit 110. If the common mode level VT1 is too low, a voltage across an internal component (e.g., a current source or a transistor) in the digital to analog converter circuit may be too low, which results in a change of a current from the internal component. With the arrangement of the calibration circuit 130, in the calibration mode, a common mode level VT2 of a signal on the output terminal O+(and/or the output terminal O−) can be pulled up to be close to the common mode level in the normal mode. As a result, the transmitter circuit 110 is able to have the biasing condition, which is close to the biasing condition in the practical applications, in the calibration mode, so that the manufacturer is able to perform more accurate circuit testing or circuit calibration.

The values of the above levels are given for illustrative purposes, and the present disclosure is not limited thereto. In some examples, the level of the output terminal O+ (and/or the output terminal O−) may be about 1.8-3.3V.

With continued reference to FIG. 1A, in some embodiments, the calibration circuit 130 is configured to, in the calibration mode, operate according to the bias voltage VB and the control signal VD, and to respectively provide a first impedance (i.e., a resistor R1) and a second impedance (i.e., a resistor R2) to the output terminals O+ and the output terminal O−. For example, the calibration circuit 130 includes a transistor P1, a transistor P2, the resistor R1, and the resistor R2. The transistor P1 and the transistor P2 are P-type transistors. A first terminal (e.g., source) of the transistor P1 receives the supply voltage VDD, a second terminal (e.g., drain) of the transistor P1 is coupled to a first terminal of the resistor R1, and a control terminal (e.g., gate) of the transistor P1 receives the control signal VD. A first terminal of the transistor P2 receives the supply voltage VDD, a second terminal of the transistor P2 is coupled to a first terminal of the resistor R2, and a control terminal of the transistor P2 receives the control signal VD. A second terminal of the resistor R1 is coupled to the output terminal O+, and a second terminal of the resistor R2 is coupled to the output terminal O−. In the calibration mode, the control signal VD has a low level (e.g., 0V). In response to the control signal VD, the transistor P1 and the transistor P2 are turned on. As a result, the resistor R1 receives the supply voltage VDD to adjust the level of the output terminal O+, and the resistor R2 receives the supply voltage VDD to adjust the level of the output terminal O−. In the normal mode, the control signal VD has a high level (e.g., the level of the supply voltage VDD). In response to the control signal VD, the transistor P1 and the transistor P2 are turned off. As a result, the resistor R1 and the resistor R2 do not affect the level of the output terminal O+ and the level of the output terminal O−.

Furthermore, a bulk of each of the transistor P1 and the transistor P2 receives the bias voltage VB. In the calibration mode or the normal mode, the level of the bias voltage VB is about the same as the level of the output terminal O+ (and/or the output terminal O−). For example, in the normal mode, the level of the output terminal O+ (and/or the output terminal O−) may be about 1.8-3.3V, and thus a level V2 of the bias voltage VB may be about 1.8-3.3V. As described above, in the normal mode, the transistor P1 and the transistor P2 are turned off. The bulk of each of the transistor P1 and the transistor P2 is coupled to an N well (not shown), and the second terminal of each of the transistor P1 and the transistor P2 is coupled to a P-type doped region (not shown). Therefore, with the bias voltage VB having the level that is close to (or the same as) the level of the output terminal O+ (and/or the output terminal O−), a P/N junction (not shown) in the transistor P1 (and/or the transistor P2) is prevented from being forward biased to generate a leakage current. In other words, in the normal mode, the calibration circuit 130 is able to reduce the leakage current according to the bias voltage VB having the level V2.

Alternatively, in the calibration mode, the level of the output terminal O+ (and/or the output terminal O−) is about 1.8V, and thus the level V1 of the bias voltage VB is about 1.8V, and the control terminals of the transistor P1 and the transistor P2 receive the control signal VD having 0V. In other words, a voltage across the gate and the bulk is about 1.8V, which is a voltage able to be withstood by transistors formed in an advanced process (e.g., 22 nanometer (nm), 12 nm, or a later process). Thus, with the bias voltage VB having the level close to (or the same as) the level of the output terminal O+ (and/or the output terminal O−), the reliability of the transistor P1 and the transistor P2 can be increased. In some embodiments, the transistor P1 and the transistor P2 may be (but not limited to) fin field-effect transistor.

Figure 2:
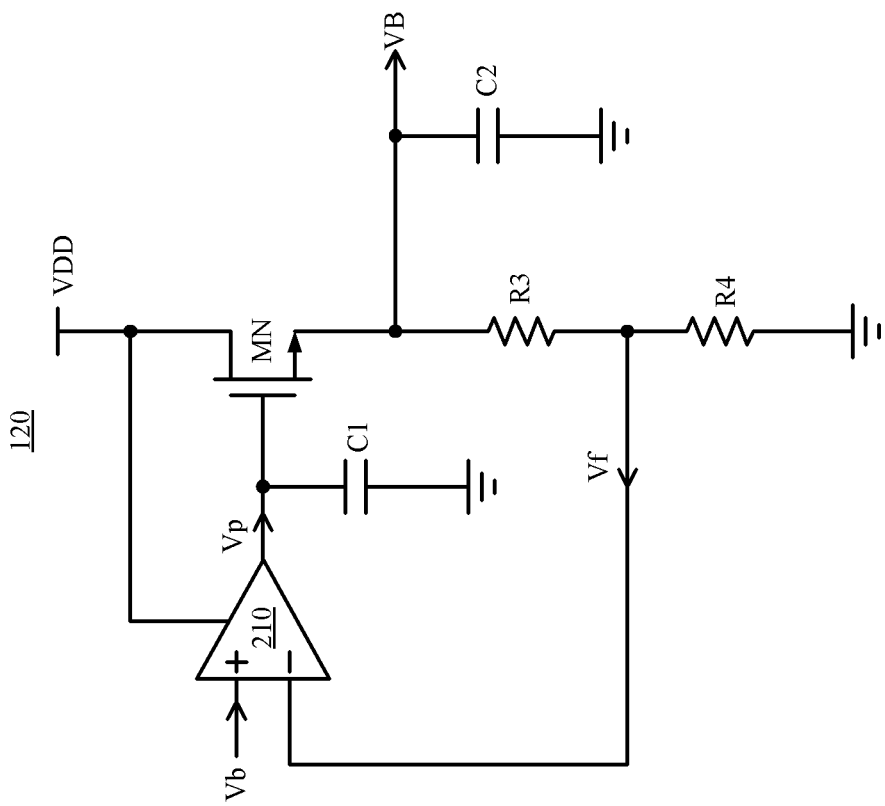
FIG. 2 is a schematic diagram of the voltage generator circuit in FIG. 1 according to some embodiments of the present disclosure.

FIG. 2 is a schematic diagram of the voltage generator circuit 120 in FIG. 1 according to some embodiments of the present disclosure. In this example, the voltage generator circuit 120 operates as a LDO regulator, which includes an error amplifier circuit 210, a transistor MN, a capacitor C1, a capacitor C2, a resistor R3, and a resistor R4. The capacitor C1 is coupled between an output terminal of the error amplifier circuit 210 and ground. A control terminal (e.g., gate) of the transistor MN is coupled to the capacitor C1 to receive a voltage Vp, a first terminal (e.g., drain) of the transistor MN is configured to receive the supply voltage VDD, and a second terminal (e.g., source) of the transistor MN is coupled to a first terminal of the resistor R3 and is configured to output the bias voltage VB. The capacitor C2 is coupled to the second terminal of the transistor MN and ground. A second terminal of the resistor R3 is coupled to a first terminal of the resistor R4, and is configured to output a voltage Vf, and a second terminal of the resistor R4 is coupled to ground. The error amplifier circuit 210 is configured to receive the voltage Vb and the voltage Vf, in order to generate the voltage Vp. In the calibration mode, the voltage Vb is switched to have the level V1. By regulating the voltage Vb, the voltage generator circuit 120 may generate the bias voltage VB having the level V1. Alternatively, in the normal mode, the voltage Vb is switched to have the level V2. The voltage generator circuit 120 thus generates the bias voltage VB having the level V2.

The arrangement of the voltage generator circuit 120 is given for illustrative purposes, and the present disclosure is not limited thereto. Various arrangements able to generate a corresponding voltage in different modes are within the contemplated scope of the present disclosure.

The types of the conductivity of various transistors (i.e., P-type or N-type) are given for illustrative purposes, and the present disclosure is not limited thereto. Transistors having various types of the conductivity able to implement similar operations and a corresponding arrangement thereof are within the contemplated scope of the present disclosure.

Figure 3:
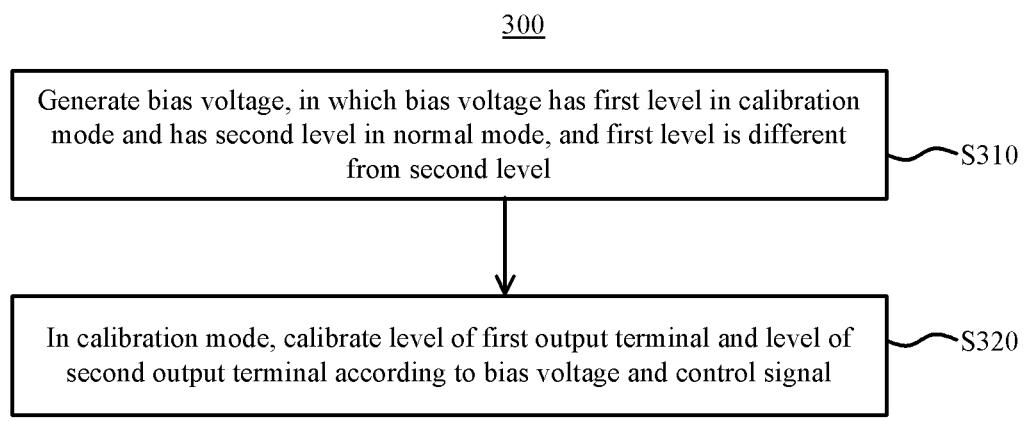
FIG. 3 is a flow chart of a calibration method according to some embodiments of the present disclosure.

FIG. 3 is a flow chart of a calibration method 300 according to some embodiments of the present disclosure. In some embodiments, the calibration method 300 may be (but not limited to) performed by the transmitter device 100 in FIG. 1A. In some embodiments, the calibration method 300 is to calibrate a common mode output level of the transmitter device 100 in a testing phase, in order to simulate biasing conditions that is similar with (or the same as) a practical environment.

In operation S310, a bias voltage is generated, in which the bias voltage has a first level in the calibration mode and has a second level in a normal mode, and the first level is different from the second level. In operation S320, a level of a first output terminal and a level of a second output terminal are calibrated according to the bias voltage and a control signal in the calibration mode.

The above operations of the calibration method 300 can be understood with reference to various embodiments discussed above, and thus the repetitious descriptions are not given. The above description of the calibration method 300 includes exemplary operations, but the operations are not necessarily performed in the order described above. Operations of the calibration method 300 may be added, replaced, changed order, and/or eliminated as appropriate, or the operations are able to be executed simultaneously or partially simultaneously as appropriate, in accordance with the spirit and scope of various embodiments of the present disclosure.

As described above, the transmitter device and the calibration method of some embodiments of the present disclosure are able to prevent the calibration circuit for testing from generating the leakage current, and to increase the reliability of internal components. As a result, the transmitter device is suitable to be implemented with transistors of advanced processes.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A transmitter device, comprising:
    a transmitter circuit configured to selectively operate in a calibration mode or a normal mode in response to a first control signal, wherein the transmitter circuit has a first output terminal and a second output terminal;
    a voltage generator circuit configured to generate a bias voltage, wherein the bias voltage has a first level in the calibration mode and has a second level in the normal mode, and the first level is different from the second level; and
    a calibration circuit configured to be turned on in the calibration mode according to the bias voltage and a second control signal, in order to calibrate a level of the first output terminal and a level of the second output terminal.

2. The transmitter device of claim 1, wherein the first output terminal has a third level in the normal mode, the second output terminal has a fourth level in the normal mode, the calibration circuit is configured to adjust the level of the first output terminal to be close to the third level, and to adjust the level of the second output terminal to be close to the fourth level in the calibration mode.

3. The transmitter device of claim 1, wherein the calibration circuit is further configured to be turned off in the normal mode according to the bias voltage and the second control signal.

4. The transmitter device of claim 1, wherein the calibration circuit is configured to reduce a leakage current of the calibration circuit in the normal mode according to the bias voltage having the second level.

5. The transmitter device of claim 1, wherein the calibration circuit is configured to provide a first impedance and a second impedance to the first output terminal and the second output terminal, respectively, in the calibration mode according to the bias voltage and the second control signal.

6. The transmitter device of claim 1, wherein the calibration circuit comprises:
    a first transistor configured to be turned on in the calibration mode according to the second control signal, and to be turned off in the normal mode according to the bias voltage and the second control signal;
    a first resistor coupled between the first transistor and the first output terminal;
    a second transistor configured to be turned on in the calibration mode according to the second control signal, and to be turned off in the normal mode according to the bias voltage and the second control signal; and
    a second resistor coupled between the second transistor and the second output terminal.

7. The transmitter device of claim 6, wherein a bulk of each of the first transistor and the second transistor is configured to receive the bias voltage.

8. The transmitter device of claim 6, wherein each of the first transistor and the second transistor is a fin field-effect transistor.

9. The transmitter device of claim 1, wherein the voltage generator circuit is a low-dropout regulator circuit.

10. The transmitter device of claim 1, wherein the first output terminal and the second output terminal are configured to be coupled to an inductive component.

11. The transmitter device of claim 1, wherein the first level is lower than the second level.

12. A calibration method for calibrating a level of a first output terminal of a transmitter circuit and a level of a second output terminal of the transmitter circuit, wherein the transmitter circuit is configured to selectively operate in a calibration mode or a normal mode in response to a first control signal, and the calibration method comprises:
    generating a bias voltage, wherein the bias voltage has a first level in the calibration mode and has a second level in the normal mode, and the first level is different from the second level; and
    calibrating the level of the first output terminal and the level of the second output terminal in the calibration mode according to the bias voltage and a second control signal.

13. The calibration method of claim 12, wherein the first output terminal has a third level in the normal mode, the second output terminal has a fourth level in the normal mode, and calibrating the level of the first output terminal and the level of the second output terminal in the calibration mode according to the bias voltage and the second control signal comprises:
    in the calibration mode, adjusting the level of the first output terminal to be close to the third level, and adjusting the level of the second output terminal to be close to the fourth level.

14. The calibration method of claim 12, wherein calibrating the level of the first output terminal and the level of the second output terminal in the calibration mode according to the bias voltage and the second control signal comprises:
    in the calibration mode, providing a first impedance and a second impedance to the first output terminal and the second output terminal, respectively, according to the bias voltage and the second control signal.

15. The calibration method of claim 12, wherein calibrating the level of the first output terminal and the level of the second output terminal in the calibration mode according to the bias voltage and the second control signal comprises:
    in the calibration mode, turning on a first transistor according to the second control signal, wherein the first transistor is coupled to the first output terminal via a first resistor; and
    in the calibration mode, turning on a second transistor according to the second control signal, wherein the second transistor is coupled to the second output terminal via a second resistor.

16. The calibration method of claim 15, further comprising:
    in the normal mode, turning off the first transistor and the second transistor according to the bias voltage and the second control signal.

17. The calibration method of claim 15, wherein a bulk of each of the first transistor and the second transistor is configured to receive the bias voltage.

18. The calibration method of claim 15, wherein each of the first transistor and the second transistor is a fin field-effect transistor.

19. The calibration method of claim 12, wherein the first output terminal and the second output terminal are configured to be coupled to an inductive component.

20. The calibration method of claim 12, wherein the first level is lower than the second level.

* * * * *